[19] United States Patent
Vadlamani et al.

(10) Patent No.: US 11,289,263 B2
(45) Date of Patent: Mar. 29, 2022

(54) ELECTRONIC SUBSTRATES HAVING EMBEDDED MAGNETIC MATERIAL USING PHOTO-IMAGABLE DIELECTRIC LAYERS

(71) Applicant: INTEL CORPORATION, Santa Clara, CA (US)

(72) Inventors: Sai Vadlamani, Chandler, AZ (US); Prithwish Chatterjee, Tempe, AZ (US); Lauren A. Link, Chandler, AZ (US); Andrew J. Brown, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 946 days.

(21) Appl. No.: 15/854,460

(22) Filed: Dec. 26, 2017

(65) Prior Publication Data

US 2019/0198228 A1 Jun. 27, 2019

(51) Int. Cl.
*H01F 27/28* (2006.01)
*H01L 23/522* (2006.01)
*H01L 49/02* (2006.01)
*H01L 23/538* (2006.01)
*H01F 17/00* (2006.01)
*H01L 21/768* (2006.01)

(52) U.S. Cl.
CPC ..... *H01F 27/2828* (2013.01); *H01F 17/0006* (2013.01); *H01L 23/5227* (2013.01); *H01L 23/5383* (2013.01); *H01L 28/10* (2013.01); *H01F 2017/0066* (2013.01); *H01F 2017/0086* (2013.01); *H01L 21/76802* (2013.01)

(58) Field of Classification Search
CPC ............ H01F 27/2828; H01L 23/5227; H01L 23/5383; H01L 28/10; H01L 21/76802; H01L 2924/15311
USPC ................................. 257/531, 532; 438/957
See application file for complete search history.

(56) References Cited

U.S. PATENT DOCUMENTS

2009/0117325 A1\* 7/2009 Gardner et al. .... H01L 23/5227
428/138
2014/0092574 A1\* 3/2014 Zillman et al. ....... H01L 23/481
2017/0290156 A1\* 5/2017 Sturcken et al. ... H01L 23/5227

\* cited by examiner

*Primary Examiner* — Thinh T Nguyen
(74) *Attorney, Agent, or Firm* — Essential Patents Group, LLP.

(57) ABSTRACT

An electronic structure may be fabricated comprising an electronic substrate having at least one photo-imageable dielectric layer and an inductor embedded in the electronic substrate, wherein the inductor comprises a magnetic material layer disposed within a via formed in the at least one photo-imageable dielectric layer and an electrically conductive via extending through the magnetic material layer. The electronic structure may further include an integrated circuit device attached to the electronic substrate and the electronic substrate may further be attached to a board, such as a motherboard.

20 Claims, 7 Drawing Sheets

ELECTRONIC SUBSTRATES HAVING EMBEDDED MAGNETIC MATERIAL USING PHOTO-IMAGABLE DIELECTRIC LAYERS

TECHNICAL FIELD

Embodiments of the present description generally relate to the field of electronic substrates and, more particularly, to the integration of magnetic materials into the electronic substrates using photo-imageable dielectric layers.

BACKGROUND ART

The integrated circuit industry is continually striving to produced ever faster and smaller integrated circuit devices for use in various server and mobile electronic products, including but not limited to, computer server products and portable products, such as wearable integrated circuit systems, portable computers, electronic tablets, cellular phones, digital cameras, and the like. However, achieving these goals increases power delivery demands for the integrated circuit devices.

These power delivery demands are supported by inductors, which are used to stabilize the current in the integrated circuit devices. As will be understood to those skilled in the art, inductors are passive electrical components that store energy in a magnetic field generated by a magnetic material and are generally standalone components that are electrically attached to the integrated circuit devices. In order to produced faster and smaller integrated circuit devices, these inductors may be embedded in electronic substrates, wherein the electronic substrates are used to route electrical signals for active and passive components in the integrated circuit devices. However, embedding inductors in the electronic substrate requires repeated patterning and planarization processes, which may be prohibitive for the production of the electronic substrate.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
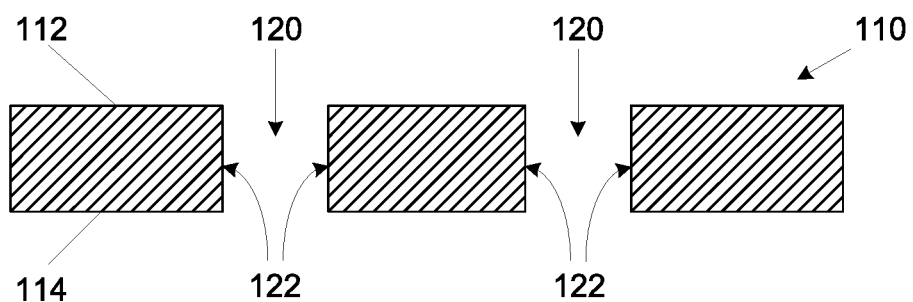
FIGS. 1-12 illustrate side cross-sectional views of a method of fabricating an electronic substrate having an embedded inductor, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description may include an electronic substrate having at least one photo-imageable dielectric layer and an inductor embedded in the electronic substrate, wherein the inductor comprises a magnetic material layer disposed within a via formed through the at least one photo-imageable dielectric layer and an electrically conductive via extending through the magnetic material layer. The electronic structure may further include an integrated circuit device attached to the electronic substrate and the electronic substrate may further be attached to a board, such as a motherboard.

As shown in FIG. 1, a substrate core 110 may be provide or fabricated, wherein the substrate core 110 may have a first surface 112 and an opposing second surface 114. The substrate core 110 may be any appropriate material, including, but not limited to, bismaleimine triazine resin, fire retardant grade 4 material, polyimide materials, glass reinforced epoxy matrix material, and the like, as well as laminates or multiple layers thereof. As further shown in FIG. 1, a plurality of vias 120 may be formed through the substrate core 110 defined by at least one side wall 122 extending from the first surface 112 to the second surface 114 thereof. The vias 120 may be formed by any known technique including but not limited to laser ablation, ion ablation, and mechanical drilling.

Figure 2:
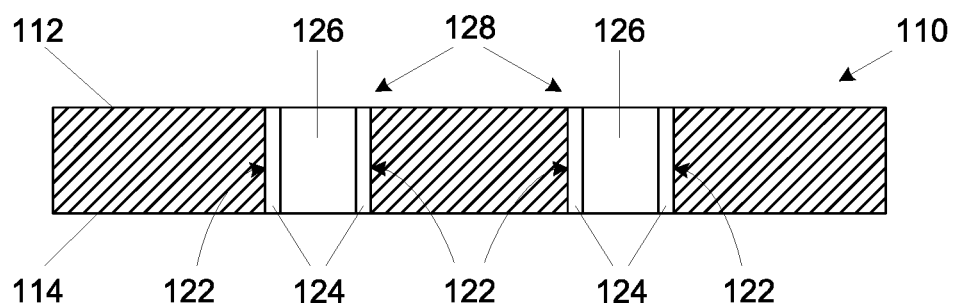

As shown in FIG. 2, the via side walls 122 may have at least one conductive layer 124 formed thereon. The conductive layer 124 may be any conductive material, including, but not limited to metals, such as copper, silver, and aluminum, and alloys thereof. The conductive layer 124 may be formed by any known technique, including, but not limited to, electroless and electrolytic plating. As further shown in FIG. 2, the vias 120 (see FIG. 1) may be filled to form a plug 126 therein, which forms a plated through-hole 128. The plug 126 may be made of any appropriate electrically conductive or non-conductive material. In one embodiment, the material used to form the plug may be an epoxy material which is selected to have a coefficient of thermal expansion that is similar to that of the substrate core 110. It is, of course, understood that the plug 126 may undergo a planarization step (such as grinding), as well as a curing step when polymeric materials are used.

Figure 3:
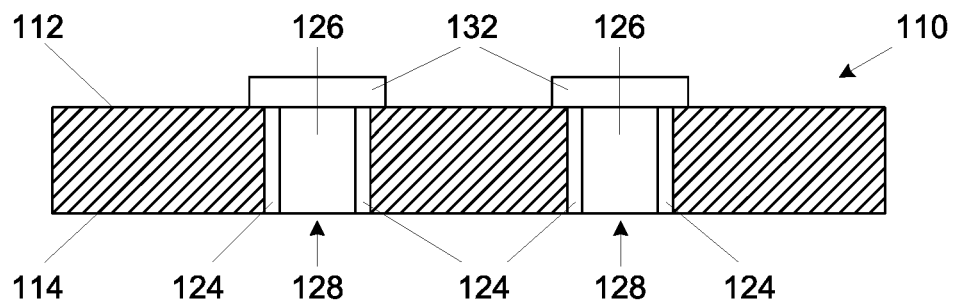
Figure 4:
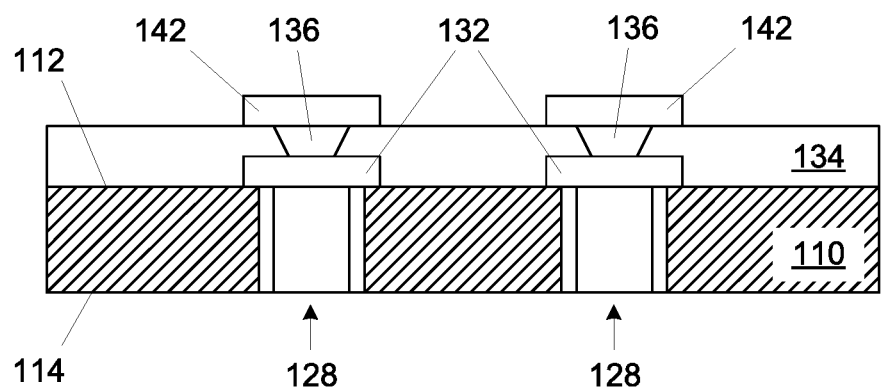

As shown in FIG. 3, at least one conductive cap 132, also known as a patterned core layer, may be formed on the first surface 112 of the substrate core 110 to contact at least one of the plated through-holes 128, by any technique known in the art. As shown in FIG. 4, a dielectric build-up film 134 may be formed, such as by lamination, on the at least one conductive cap 132 and the first surface 112 of the substrate core 110. As further shown in FIG. 4, at least one first level conductive via 136 may be formed through the dielectric build-up film 134 to electrically contact the at least one conductive cap 132, by any technique known in the art. As still further shown in FIG. 4, at least one first contact 142 may be formed on the at least first level one conductive via 136, by any technique known in the art.

Figure 5:
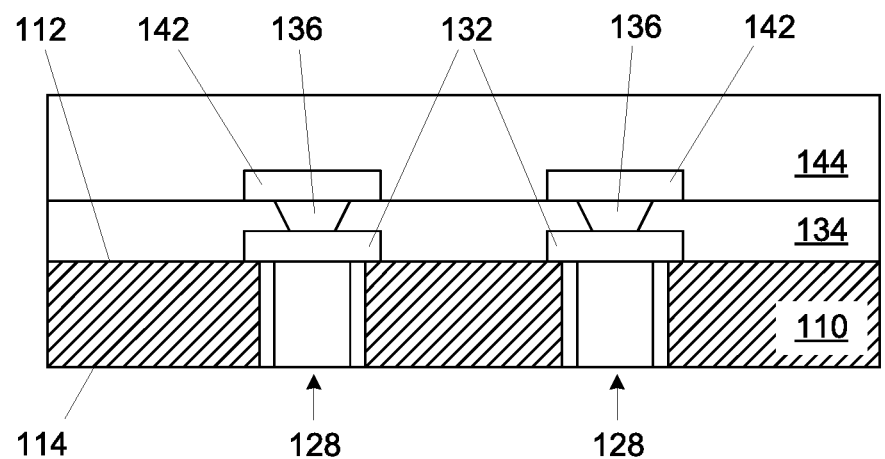
Figure 6:
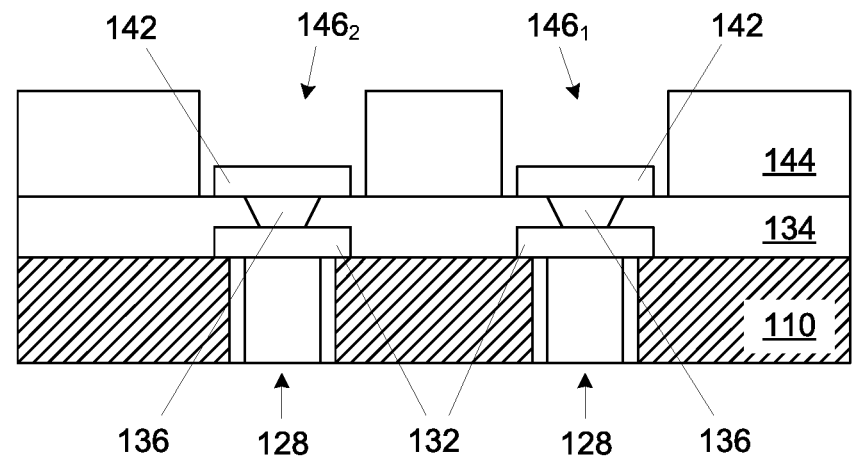

As shown in FIG. 5, a first photo-imageable dielectric layer 144 may be formed over the at least one first contact 142 and the dielectric build-up film 134, such as by lamination. As shown in FIG. 6, at least one first dielectric layer opening (illustrated as elements $146_1$ and $146_2$) may be formed through the first photo-imageable dielectric layer 144 to expose the first contacts 142. A photo-imageable dielectric is a material that can be patterned using lithographic techniques without having to remove the materials post patterning, like conventional sacrificial materials. If the first photo-imageable dielectric layer 144 is positive tone, it may be exposed, such as through a lithography mask, to a light source, such as ultraviolet light, which changes the chemical structure of the exposed portions of the first photo-imageable dielectric layer 144 such that it becomes more soluble to a selected solution and are washed away by the selected solution to form the at least one first dielectric opening $146_1$ and $146_2$. If the first photo-imageable dielectric layer 144 is negative tone, it may be exposed, such as through a lithography mask, to a light source, such as ultraviolet light, which changes the chemical structure of the exposed portions of the first photo-imageable dielectric layer 144 such that it becomes less soluble to a selected solution and the portions that are not exposed are washed away with the selected solution to form the at least one first dielectric opening $146_1$ and $146_2$. In various embodiments, the first photo-imageable dielectric layer 144 may be formulated using molecular chains selected from the group consisting of diazoketones, diazoalkyl naphthalenes, diazobenzoketones, and indene carboxylic acids.

Figure 7:
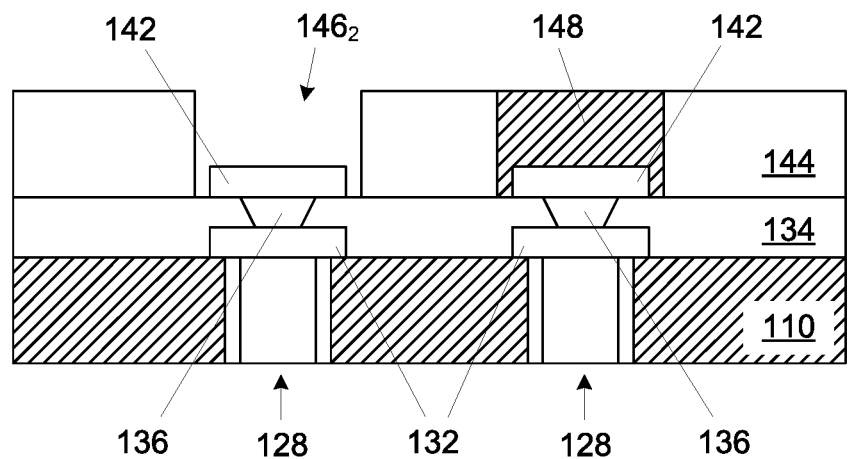

As shown in FIG. 7, a first magnetic material layer 148 may be formed by disposing a magnetic material into at least one of the first dielectric openings (illustrated as opening $146_1$ of FIG. 6). The magnetic material may be a flowable material, such as a paste or an ink type material, which can be stencil printed into the first dielectric opening $146_1$ (see FIG. 6). The magnetic material used to form the first magnetic material layer 148 may be any appropriate material, including, but not limited to, magnetic particles, such as ferromagnetic particles, disposed in a carrier material, such as a polymer resin.

Figure 8:
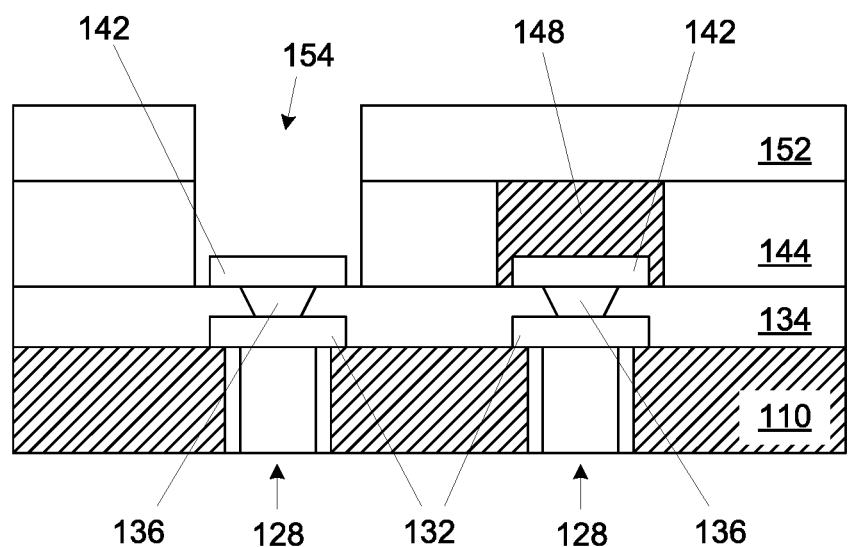
Figure 9:
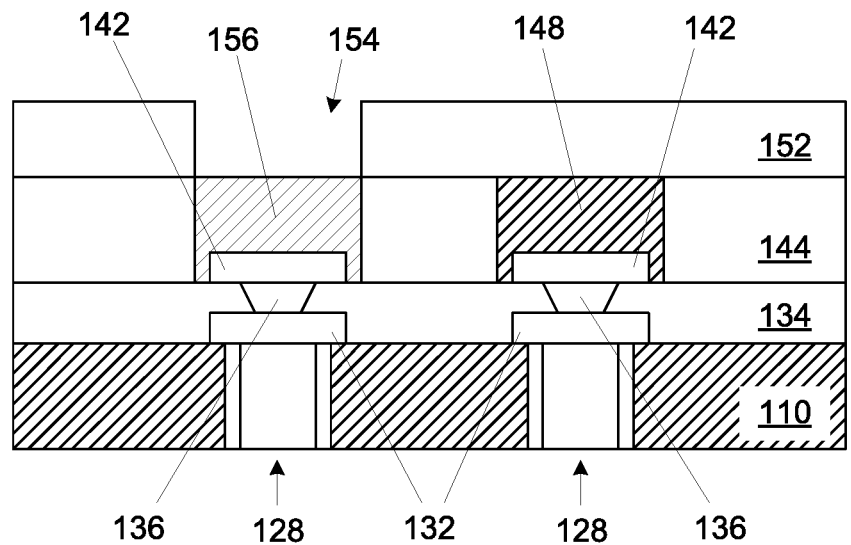

As shown in FIG. 8, a mask layer 152 may be formed having a mask opening 154 to expose at least one of the first dielectric openings (illustrated as opening $146_2$ of FIG. 7). As shown in FIG. 9, a conductive material (such as copper, aluminum, tungsten, and the like) may be disposed in at least one of the first dielectric openings (illustrated as opening $146_2$ of FIG. 7) to form a first conductive trace 156. The first conductive trace 156 may be formed by any technique known in the art, including, but not limited to, plating. It is understood that a seed layer (not shown) may be deposited prior to plating the conductive material to form the first conductive trace 156. As will be understood to those skilled in the art, the process described allows for the formation of the first conductive trace 156 and the first magnetic material layer 148 in an asymmetrical manner.

Figure 10:
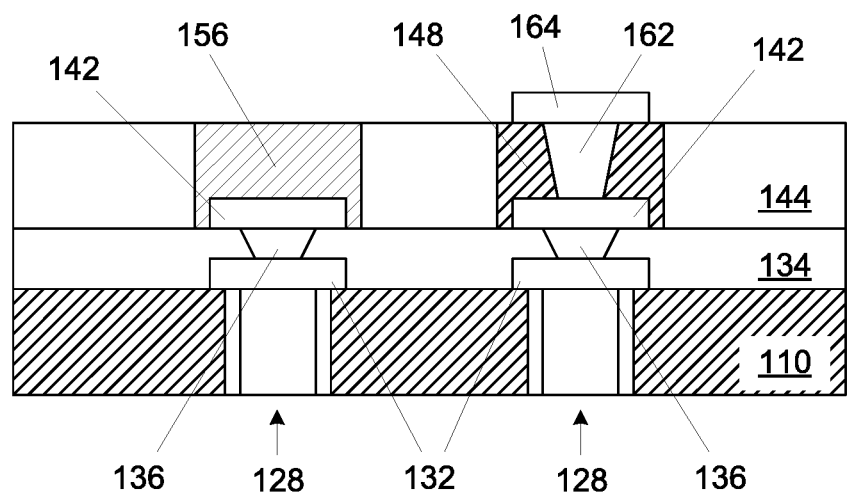
Figure 11:
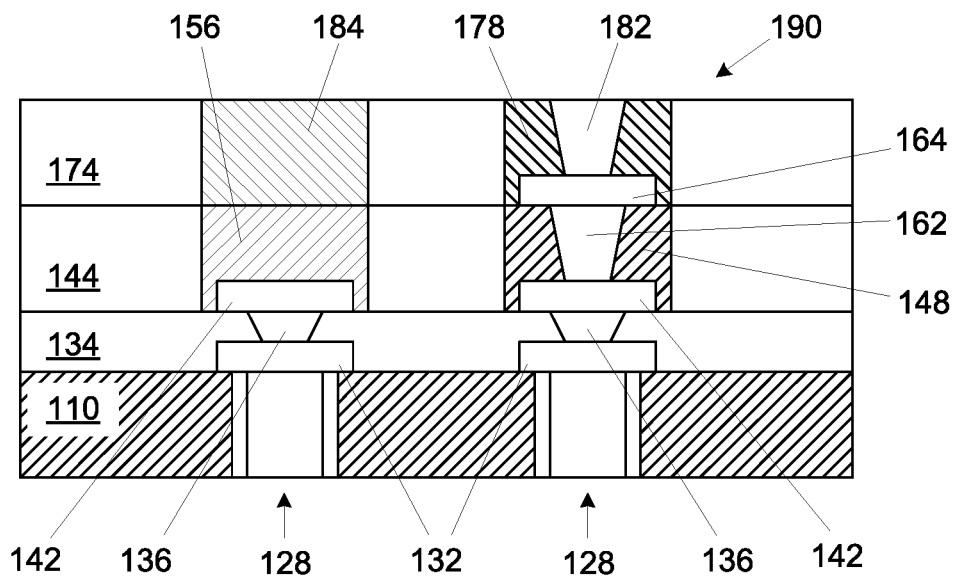

As shown in FIG. 10, the mask layer 152 (see FIG. 9) may be removed and a first inductor conductive via 162 may be formed through the first magnetic material layer 148 and a first inductor contact 164 may be formed on the first magnetic material layer 148 in electrical contact with the first inductor conductive via 162. As shown in FIG. 11, the processes illustrated in FIGS. 5-10 may be repeated to form a second photo-imageable dielectric layer 174 over the at least one first inductor contact 164 and the first photo-imageable dielectric layer 144, a second magnetic material layer 178 in the second photo-imageable dielectric layer 174, a second inductor conductive via 182 formed through the second magnetic material layer 178, and a second conductive trace 184 in the second photo-imageable dielectric layer 174 contacting the first conductive trace 156 to form at least a portion of an inductor 190.

Figure 12:
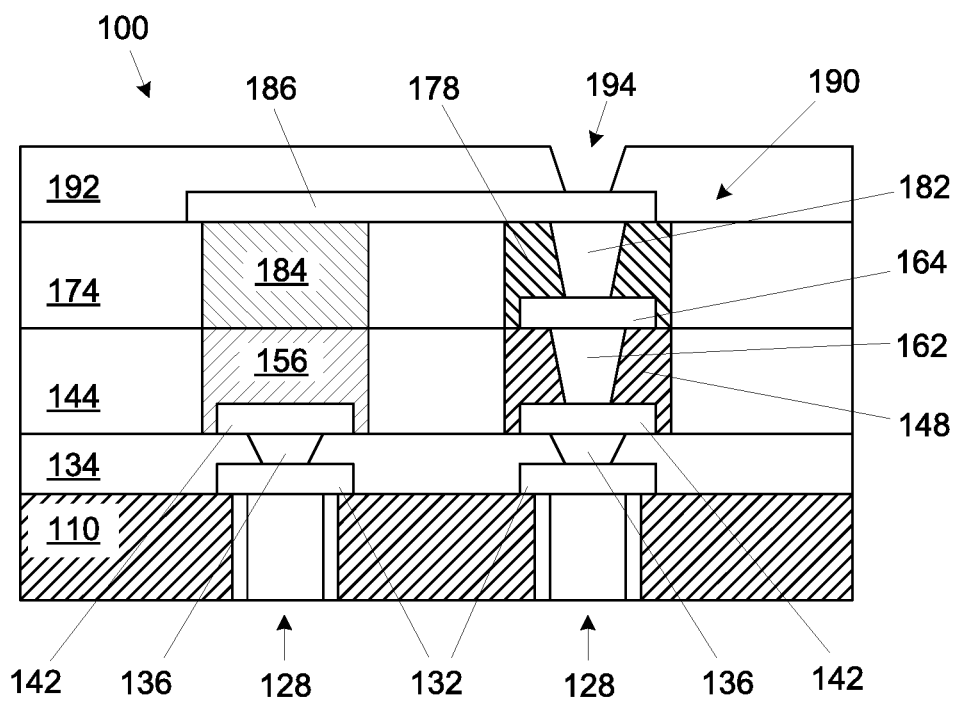

As shown in FIG. 12, in one embodiment of the present description, a third conductive trace 186 may be formed on the second photo-imageable dielectric layer 174 to electrically connect the second conductive trace 184 to the second inductor conductive via 182. A solder resist layer 192 may be formed on the second photo-imageable dielectric layer 174 having an opening 194 formed therethrough to expose a portion of the third conductive trace 186, thereby forming at least a portion of an electronic substrate 100. As will be understood to those skilled in the art, an interconnect structure (not shown) may be formed in the opening 194.

Figure 13:
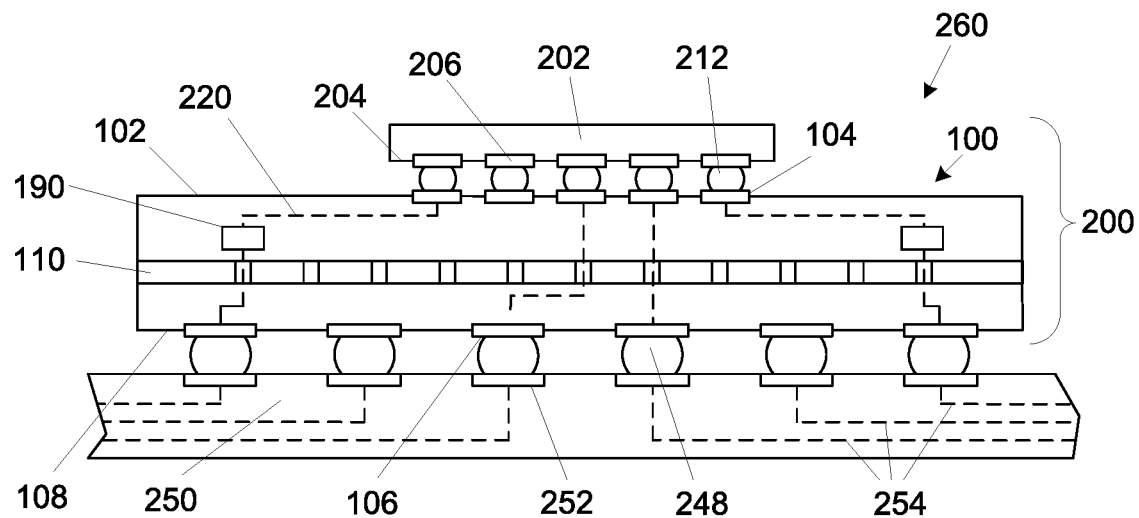
FIG. 13 illustrates a side cross-sectional view of an electronic structure having an inductor embedded in an electronic substrate, wherein the electronic substrate is electrically attached to an electronic board and wherein an integrated circuit device is electrically attached to the electronic substrate, according to an embodiment of the present description.

As shown in FIG. 13, in one embodiment of the present description, the electronic substrate 100 of FIG. 12 may have an integrated circuit device 202, such as a microprocessor, a chipset, a graphics device, a wireless device, a memory device, an application specific integrated circuit, or the like, attached thereto to form an electronic package 200. The integrated circuit device 202 may be attached to a first surface 102 of the electronic substrate 100 through a plurality of interconnects 212. The device-to-substrate interconnects 212 may extend between bond pads 206 on a first surface 204 of the integrated circuit device 202 and substantially mirror-image bond pads 104 on the electronic substrate first surface 102. The integrated circuit device bond pads 206 may be in electrical communication with integrated circuitry (not shown) within the integrated circuit device 202.

The electronic package 200 may be attached to an electronic board 250, such as a motherboard, through a plurality of interconnects 248 to form an electronic structure 260. The package-to-board interconnects 248 may extend between bond pads 106 on a second surface 108 of the electronic substrate 100 and substantially mirror-image bond pads 252 on the electronic board 250. The bond pads 252 of the electronic board 250 may be in electrical communication with board communication routes (illustrated as dashed lines 254), which may be in electrical communication with components (not shown) external to the electronic package 200.

The electronic substrate bond pads 106 may be in electrical communication with electrical communication routes (illustrated as dashed lines 220 within the electronic substrate 100). These electrical communication routes 220 may form electronic contact between the electronic board 250 and the integrated circuit device 202, which may include electrical contact with the inductor 190 within the electronic substrate 100. It is understood that the plated through-holes 128 (see FIG. 12), the at least one conductive cap 132 (see FIG. 12), the first conductive trace 156 (see FIG. 12), the second conductive trace 184 (see FIG. 12), and the third conductive trace 186 (see FIG. 12) may be part of the electrical communication routes 220.

When solder balls or bumps are used to form the device-to-substrate interconnects 212 and/or the package-to-board interconnects 248, the solder may be any appropriate material, including, but not limited to, lead/tin alloys and high tin content alloys (e.g. about 90% or more tin), and similar alloys. The solder may be reflowed, either by heat, pressure, and/or sonic energy. Although the device-to-substrate interconnects 212 are shown as reflowable solder bumps or balls, they may be pins, lands, or wire bonds, as known in the art.

The electrical communication routes 220 may be made of multiple layers of conductive traces, such as copper or aluminum, built up on and through dielectric layers, which are laminated on either side of the substrate core 110. The board communication routes 254 may be made of multiple layers of conductive traces, such as copper or aluminum, built up on and through dielectric layers, as will be understood to those skilled in the art.

Figure 14:
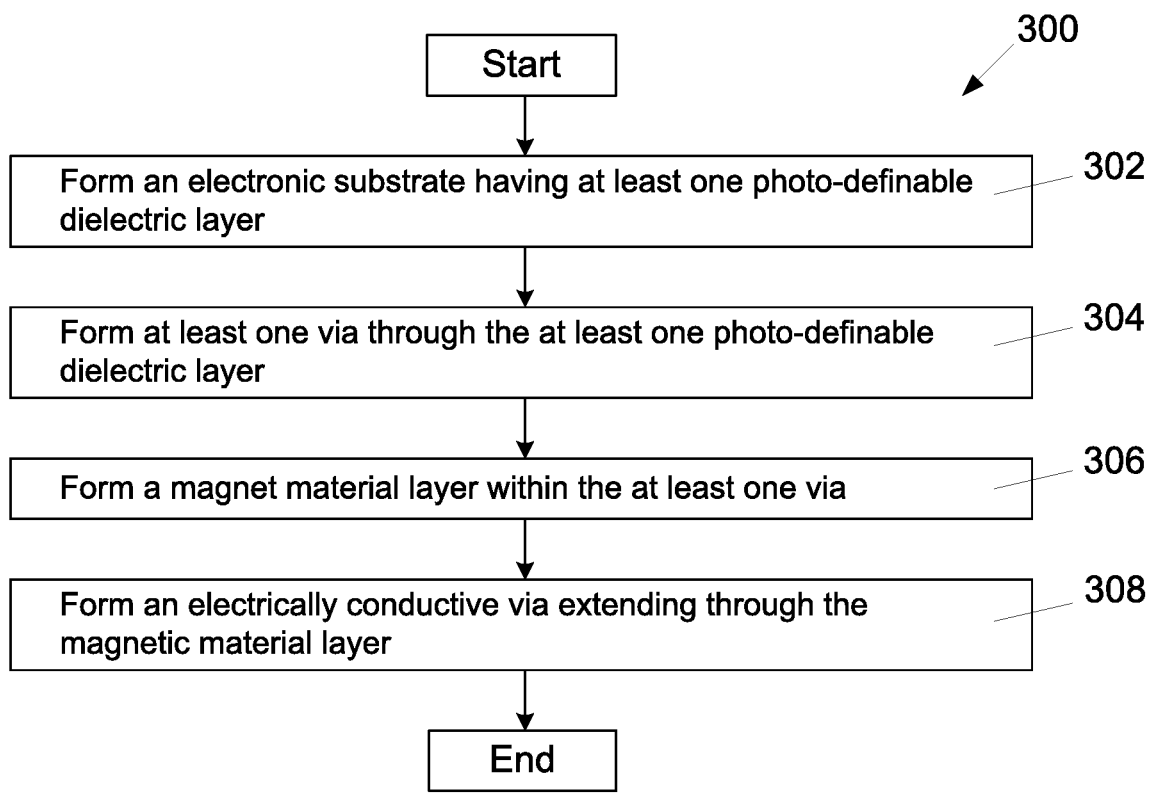
FIG. 14 is a flow chart of a process of fabricating an integrated circuit package, according to an embodiment of the present description.

FIG. 14 is a flow chart of a process 300 of fabricating an electronic structure, according to the various embodiments of the present description. As set forth in block 302, an electronic substrate may be formed having at least one photo-imageable layer. At least one via may be formed through the photo-imageable layer, as set forth in block 304. As set forth in block 306, a magnetic material layer may be formed within the at least one via. An electrically conductive via may be formed extending through the magnetic material layer, as set forth in block 308.

Figure 15:
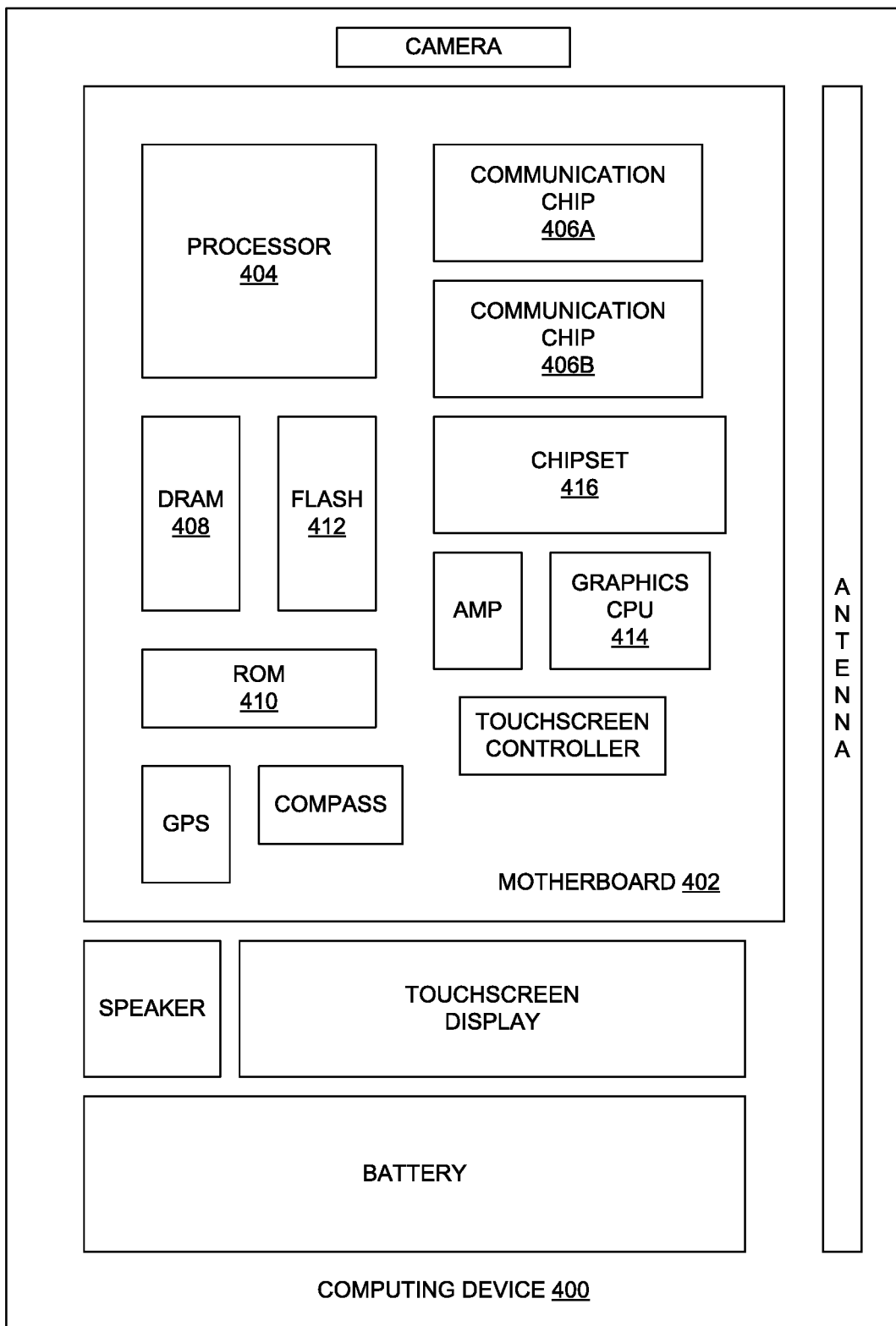
FIG. 15 illustrates an electronic system/device, according to one implementation of the present description.

FIG. 15 illustrates an electronic system or computing device 400 in accordance with one implementation of the present description. The computing device 400 may house a board 402. The board 402 may include a number of integrated circuit components attached thereto, including but not limited to a processor 404, at least one communication chip 406A, 406B, volatile memory 408, (e.g., DRAM), non-volatile memory 410 (e.g., ROM), flash memory 412, a graphics processor or CPU 414, a digital signal processor (not shown), a crypto processor (not shown), a chipset 416, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the integrated circuit components may be physically and electrically coupled to the board 402. In some implementations, at least one of the integrated circuit components may be a part of the processor 404.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others The term "processor" may refer to any device or portion of a device that processes electronic data from registers and/or memory to transform that electronic data into other electronic data that may be stored in registers and/or memory.

Any of the integrated circuit components within the computing device 400 may include an inductor embedded in an electronic substrate, wherein the electronic substrate has at least one photo-imageable dielectric layer having a via formed therein and within the inductor comprises a magnetic material disposed within the via of the photo-imageable dielectric layer and an electrically conductive via extending through the magnetic material.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-15. The subject matter may be applied to other integrated circuit device and assembly applications, as will be understood to those skilled in the art.

The following examples pertain to further embodiments, wherein Example 1 is an inductor comprising a photo-imageable dielectric layer having a via formed therethrough; a magnetic material layer disposed within the via of the photo-imageable dielectric layer; and an electrically conductive via extending through the magnetic material layer.

In Example 2, the subject matter of Example 1 can optionally include the photo-imageable dielectric layer comprising molecular chains selected from the group consisting of diazoketones, diazoalkyl naphthalenes, diazobenzoketones, and indene carboxylic acids.

In Example 3, the subject matter of either Examples 1 or 2 can optionally include magnetic material layer comprising magnetic particles disposed in a carrier material.

The following examples pertain to further embodiments, wherein Example 4 is an electronic structure, comprising an electronic substrate having at least one photo-imageable dielectric layer; and an inductor embedded in the electronic substrate, wherein the inductor comprises a magnetic material layer disposed within a via formed through the at least one photo-imageable dielectric layer and an electrically conductive via extending through the magnetic material layer.

In Example 5, the subject matter of Example 4 can optionally include the photo-imageable dielectric layer comprising molecular chains selected from the group consisting of diazoketones, diazoalkyl naphthalenes, diazobenzoketones, and indene carboxylic acids.

In Example 6, the subject matter of either Examples 4 or 5 can optionally include magnetic material layer comprising magnetic particles disposed in a carrier material.

In Example 7, the subject matter of Example 4 can optionally include an integrated circuit device attached to a first surface of the electronic substrate.

In Example 8, the subject matter of Example 4 can optionally include the electronic substrate including a substrate core.

In Example 9, the subject matter of Example 8 can optionally include the substrate core further including a plurality of through-hole vias.

The following examples pertain to further embodiments, wherein Example 10 is an electronic system, comprising a board and an electronic package attached to the board, wherein the electronic package comprises an electronic substrate having at least one photo-imageable dielectric layer; an inductor embedded in the electronic substrate, wherein the inductor comprises a magnetic material layer disposed within a via formed in the at least one photo-imageable dielectric layer and an electrically conductive via extending through the magnetic material layer; and an integrated circuit device electrically attached to the electronic substrate.

In Example 11, the subject matter of Example 10 can optionally include the photo-imageable dielectric layer comprising molecular chains selected from the group consisting of diazoketones, diazoalkyl naphthalenes, diazobenzoketones, and indene carboxylic acids.

In Example 12, the subject matter of either Examples 10 or 11 can optionally include magnetic material layer comprising magnetic particles disposed in a carrier material.

In Example 13, the subject matter of Example 10 can optionally include the electronic substrate including a substrate core.

In Example 14, the subject matter of Example 13 can optionally include the substrate core further including a plurality of through-hole vias.

The following examples pertain to further embodiments, wherein Example 15 is a method of forming an electronic structure, comprising forming an electronic substrate having at least one photo-imageable dielectric layer; forming at least one via through the at least one photo-imageable dielectric layer; forming a magnetic material layer within the at least one via; and forming an electrically conductive via extending through the magnetic material layer.

In Example 16, the subject matter of Example 15 can optionally include the photo-imageable dielectric layer comprising molecular chains selected from the group consisting of diazoketones, diazoalkyl naphthalenes, diazobenzoketones, and indene carboxylic acids.

In Example 17, the subject matter of either Examples 15 or 16 can optionally include forming the magnetic material layer from a material comprising magnetic particles disposed in a carrier material.

In Example 18, the subject matter of Example 15 can optionally include electrically attaching an integrated circuit device attached to a first surface of the electronic substrate.

In Example 19, the subject matter of Example 15 can optionally include forming the electronic substrate including forming a substrate core and wherein at least one photo-imageable dielectric layer is formed on the substrate core.

In Example 20, the subject matter of Example 19 can optionally include forming the substrate core further including forming a plurality of through-hole vias.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An inductor, comprising:
    a photo-imageable dielectric layer having a via formed therethrough;
    a magnetic material layer disposed within the via of the photo-imageable dielectric layer; and
    an electrically conductive via extending through the magnetic material layer, wherein the electrically conductive via comprises an inductor conduct via and a contact, wherein the inductor conductive via and the contact are disposed within the via formed through the at least one photo-imageable dielectric layer, and wherein the magnetic material layer directly contacts the inductor conductive via and the contact.

2. The inductor of claim 1, wherein the photo-imageable dielectric layer comprises molecular chains selected from the group consisting of diazoketones, diazoalkyl naphthalenes, diazobenzoketones, and indene carboxylic acids.

3. The inductor of claim 1, wherein the magnetic material layer comprises magnetic particles disposed in a carrier material.

4. An electronic structure, comprising:
    an electronic substrate having at least one photo-imageable dielectric layer; and
    an inductor embedded in the electronic substrate, wherein the inductor comprises a magnetic material layer disposed within a via formed through the at least one photo-imageable dielectric layer and an electrically conductive via extending through the magnetic material layer, wherein the electrically conductive via comprises an inductor conduct via and a contact, wherein the inductor conductive via and the contact are disposed within the via formed through the at least one photo-imageable dielectric layer, and wherein the magnetic material layer directly contacts the inductor conductive via and the contact.

5. The electronic structure of claim 4, wherein the photo-imageable dielectric layer comprises molecular chains selected from the group consisting of diazoketones, diazoalkyl naphthalenes, diazobenzoketones, and indene carboxylic acids.

6. The electronic structure of claim 4, wherein the magnetic material layer comprises magnetic particles disposed in a carrier material.

7. The electronic structure of claim 4, further comprising an integrated circuit device attached to a first surface of the electronic substrate.

8. The electronic structure of claim 4, wherein the electronic substrate includes a substrate core.

9. The electronic structure of claim 8, wherein the substrate core further includes a plurality of through-hole vias.

10. An electronic system, comprising:
a board; and
an electronic package attached to the board, wherein the electronic package comprises:
an electronic substrate having at least one photo-imageable dielectric layer;
an inductor embedded in the electronic substrate, wherein the inductor comprises a magnetic material layer disposed within a via formed in the at least one photo-imageable dielectric layer and an electrically conductive via extending through the magnetic material layer; and
an integrated circuit device electrically attached to the electronic substrate, wherein the electrically conductive via comprises an inductor conduct via and a contact, wherein the inductor conductive via and the contact are disposed within the via formed through the at least one photo-imageable dielectric layer, and wherein the magnetic material layer directly contacts the inductor conductive via and the contact.

11. The electronic system of claim 10, wherein the photo-imageable dielectric layer comprises molecular chains selected from the group consisting of diazoketones, diazoalkyl naphthalenes, diazobenzoketones, and indene carboxylic acids.

12. The electronic system of claim 10, wherein the magnetic material comprises magnetic particles disposed in a carrier material.

13. The electronic system of claim 10, wherein the electronic substrate includes a substrate core.

14. The electronic system of claim 13, wherein the substrate core further includes forming a plurality of through-hole vias.

15. A method of fabricating an electronic structure, comprising:
forming an electronic substrate having at least one photo-imageable dielectric layer;
forming at least one via through the at least one photo-imageable dielectric layer;
forming a magnetic material layer within the at least one via; and
forming an electrically conductive via extending through the magnetic material layer, wherein the electrically conductive via comprises an inductor conduct via and a contact, wherein the inductor conductive via and the contact are disposed within the via formed through the at least one photo-imageable dielectric layer, and wherein the magnetic material layer directly contacts the inductor conductive via and the contact.

16. The method of claim 15, wherein forming the electronic substrate having at least one photo-imageable dielectric layer comprises the at least one photo-imageable dielectric layer comprising molecular chains selected from the group consisting of diazoketones, diazoalkyl naphthalenes, diazobenzoketones, and indene carboxylic acids.

17. The method of claim 16, wherein forming the magnetic material layer comprises forming the magnetic material layer from a material comprising magnetic particles disposed in a carrier material.

18. The method of claim 15, further comprising electrically attaching an integrated circuit device to the electronic substrate.

19. The method of claim 15, wherein forming the electronic substrate includes forming a substrate core and wherein at least one photo-imageable dielectric layer is formed on the substrate core.

20. The method of claim 19, wherein forming the substrate core further includes forming a plurality of through-hole vias.

* * * * *